United States Patent [19]
Johnson

[11] Patent Number: 5,638,025
[45] Date of Patent: Jun. 10, 1997

[54] AMPLIFIED OUTPUT STAGE CONTAINING N-CHANNEL OUTPUT TRANSISTORS AND CAPACITIVE COUPLING STAGE

[75] Inventor: Nick M. Johnson, Los Altos, Calif.

[73] Assignee: National Semiconductor Corporation, Santa Clara, Calif.

[21] Appl. No.: 499,499

[22] Filed: Jul. 7, 1995

[51] Int. Cl.$^6$ .................................................. H03F 3/30
[52] U.S. Cl. ........................................ 337/255; 330/269
[58] Field of Search .................................. 330/255, 269, 330/273, 274, 307; 327/108, 112, 434, 436

[56] References Cited

U.S. PATENT DOCUMENTS

| | | | |
|---|---|---|---|
| 4,336,503 | 6/1982 | Whatley . | |
| 4,390,803 | 6/1983 | Koike | 327/108 |
| 4,542,348 | 9/1985 | Lucas et al. | 330/269 X |
| 5,220,288 | 6/1993 | Brooks | 330/255 |

OTHER PUBLICATIONS

Analysis and Design of Analog Integrated Circuits, Second Edition, Paul R. Gray and Robert G. Meyer, University of California, Berkeley, pp. 335, 758.
Class–AB High–Swing CMOS Power Amplifier, F. Mistlberger and R. Koch, IEEE Journal of Solid–state Circuits, vol. 27, No. 7, Jul. 1992, pp. 1089–1092.

Primary Examiner—James B. Mullins
Attorney, Agent, or Firm—Skjerven, Morrill, MacPherson, Franklin & Friel; David E. Steuber

[57] ABSTRACT

An output stage of an amplifier contains N-channel high-side and low-side transistors for producing an output current. The gate drive circuitry for the transistors includes an N-channel transistor having its gate connected in common with the gate of the low-side transistor to the output of a high-gain input stage amplifier, and having its drain connected to the gate of the high-side transistor. This structure reduces distortion at the crossover between positive and negative output voltages and improves control of the quiescent current. Avoiding a P-channel low-side transistor also reduces the area required for the amplifier on an IC chip and eliminates clipping during negative swings of the output voltage. A capacitive coupling stage is used to prevent clipping during positive swings of the output voltage. When the gate drive for the high-side transistor goes low, a capacitor charges through a diode. When the gate drive goes high again, the diode becomes reverse-biased, and a P-channel transistor turns on to deliver the charge on the capacitor to the gate of the high-side transistor, providing a gate bias above the positive voltage rail. The capacitor can be fabricated in integrated form.

21 Claims, 11 Drawing Sheets

AMPLIFIED OUTPUT STAGE CONTAINING N-CHANNEL OUTPUT TRANSISTORS AND CAPACITIVE COUPLING STAGE

FIELD OF THE INVENTION

This invention relates to amplifiers and inverters, and in particular to circuitry for improving the performance of such devices.

BACKGROUND OF THE INVENTION

The output stages of amplifiers and power inverters typically include a high-side transistor and a low-side transistor connected in a series path between a positive and negative voltage supplies or rails, "positive" and "negative" being used only in a relative sense. A common node between the high-side and low-side transistors is connected through a load resistor to a reference voltage (e.g., ground). As the high-side and low-side transistors are alternately switched on and off, the node fluctuates in the range between the positive and negative voltage rails and the current through the load resistor varies in magnitude and direction. The output of the amplifier or inverter is the voltage that appears across the load resistance.

A circuit diagram of a conventional audio amplifier 10 is shown in FIG. 1A. A complementary pair of transistors, including a high-side N-channel transistor $Q_A$ and a low-side P-channel transistor $Q_B$, are connected in a series path between the positive voltage rail V+ and the negative voltage rail V−. The common node N between transistors $Q_A$ and $Q_B$ is connected through a load resistor $R_L$ to ground. The output voltage $V_{OUT}$ is taken across load resistor $R_L$.

The drive circuitry for the gates of transistors $Q_A$ and $Q_B$ includes a current source I and a complementary transistor pair including transistors $Q_C$ and $Q_D$, each of which has its drain shorted to its gate. A current source I supplies a current $I_3$ to transistors $Q_C$ and $Q_D$ as well as an N-channel transistor $Q_E$. Transistors $Q_C$ and $Q_D$ are typically much smaller than transistors $Q_A$ and $Q_B$ and act as current mirrors for transistors $Q_A$ and $Q_B$, respectively. The output of a high-gain differential amplifier A is delivered to the gate of transistor $Q_E$. As the output of differential amplifier A varies, the gate drive circuitry (including transistors $Q_C$, $Q_D$ and $Q_E$) causes an output current $I_{OUT}$ to vary in such a way that an output voltage $V_{OUT}$ is produced across the load resistor $R_L$. For example, as the high-side transistor $Q_A$ is turned progressively on, the low-side transistor $Q_B$ is turned progressively off, so that the high-side current $I_1$ exceeds the low-side current $I_2$. The output current $I_{OUT}=I_1-I_2$ thus flows from the positive voltage rail V+ through resistor $R_L$ to ground. Conversely, as the high-side transistor $Q_A$ is turned progressively off, the low-side transistor $Q_B$ is turned progressively on. The high-side current $I_1$ then falls below the low-side current $I_2$, and the output current flows from ground through resistor $R_L$ to the negative voltage rail V−.

Amplifier 10 presents several problems. First, ideally transistor $Q_C$ should be perfectly matched to transistor $Q_A$, and transistor $Q_D$ should be perfectly matched to transistor $Q_B$. Otherwise, amplifier 10 will not have a stable and predictable quiescent current (i.e., the current that flows through transistors $Q_A$ and $Q_B$ when $I_{OUT}=0$), and dead zones or overlap can occur when the input voltage is near the zero point. In FIG. 1B, the solid line shows a dead zone which occurs when both transistor $Q_A$ and transistor $Q_B$ are nonconductive (i.e., $I_1=I_2=0$) in some interval around $V_{IN}=0$; and the dashed line shows the overlap which occurs when both transistor $Q_A$ and transistor $Q_B$ are conductive at $V_{IN}=0$.

An article by F. Mistlberger and R. Koch ("Class-AB High-Swing CMOS Power Amplifier", IEEE Journal of Solid State Circuits, Vol. 27, No. 7, July 1992, pp. 1089–1092) describes a circuit for solving this problem, shown in simplified form in FIG. 2A, which in effect displaces the dead zones out of the critical low amplitude region, producing a waveform of the kind shown in FIG. 2B. This solution requires three differential amplifiers, however, and is complex.

A second problem arises because the gates of transistors $Q_A$ and $Q_B$ can never be biased beyond the voltage rails V+ and V−, respectively. Thus, for example, as transistor $Q_A$ becomes more conductive, and its source voltage approaches V+, the source-to-gate voltage $V_{GS}$ of transistor $Q_A$ is limited and transistor $Q_A$ can not be driven into the triode or resistive region. Similarly, the gate of transistor $Q_B$ cannot be pushed below V−, and this prevents transistor $Q_B$ from being driven into the triode region.

This effect is illustrated in FIG. 1C, which shows the variation of $V_{OUT}$ as $V_{IN}$ oscillates between V+ and V−. It will be noted that $V_{OUT}$ is clipped as $V_{IN}$ approaches the positive and negative voltage rails.

A known solution to this problem is shown in FIG. 3A, wherein a charge pump arrangement is used to boost the voltage at the gate of transistor $Q_A$. In this arrangement, the positive terminal of current source I is connected to a common node between a bootstrap capacitor $C_B$ and a diode $D_B$. Capacitor $C_B$ and diode $D_B$ are connected in series between the output of the amplifier and V+. Bootstrap capacitor $C_B$ charges as $V_{OUT}$ falls, with a current being drawn through diode $D_B$. As $V_{OUT}$ increases, the voltage across capacitor $C_B$ remains roughly constant in the short term, and the positive terminal of current source I and the gate of transistor $Q_A$ are driven above V+. This is illustrated in FIG. 3B, where $V_{BOOST}$ is the voltage at the common node between diode $D_B$ and capacitor $C_B$ and $V_{GATE}$ is the gate voltage of transistor $Q_A$. As is evident in FIG. 3B, the gate reaches a level above V+, and accordingly the $V_{GS}$ of transistor $Q_A$ is not limited and the clipping of $V_{OUT}$ is eliminated. As will be apparent, a similar charge pump can be connected to the source of transistor $Q_E$ to drive the gate of transistor $Q_B$ below the negative voltage rail V−.

Although the circuitry shown in FIG. 3A overcomes the clipping problem described above, it is not without disadvantages. The bootstrap capacitor $C_B$ must be fairly large because it must support the current flowing through the current source I and the transistors $Q_C$, $Q_D$ and $Q_E$. Thus, assuming that the amplifier is formed on an IC chip, capacitor $C_B$ must typically be fabricated as a discrete element. This requires an additional pin on the chip.

An additional disadvantage of the amplifier 10 shown in FIG. 1A is that is contains a P-channel output transistor $Q_B$. As is well known, P-channel transistors must be larger than N-channel transistors to carry an equivalent current. Thus, assuming that the amplifier is integrated, the use of a P-channel output transistor sacrifices valuable chip area which could otherwise be devoted to other purposes.

These problems are overcome in an output stage according to this invention.

SUMMARY OF THE INVENTION

In the output stage of this invention, the output transistor pair includes two N-channel transistors. The output of the input stage differential amplifier is connected to the gate of the low-side N-channel transistor. This eliminates the P-channel output transistor, which has the size problem mentioned above, and also eliminates clipping when the output voltage swings low, since the source-to-gate voltage of an N-channel transistor used on the low side is not limited as the transistor turns on.

The gate drive circuitry for the high-side transistor includes an N-channel gate drive transistor which has its source connected to the low voltage supply rail and its gate connected to the output of the input stage differential amplifier. Typically, the N-channel gate drive transistor is relatively small as compared to high-side and low-side output transistors. A current source supplies the N-channel gate drive transistor through its drain terminal. In one embodiment, the drain terminal of the gate drive transistor is connected directly to the gate of the high-side transistor.

When the input voltage is near the low end of its range, a high load current flows through the N-channel low-side transistor, and the output of the differential amplifier is high to maintain this current. The drain of the gate drive transistor is near the low voltage rail and drives the gate of the high-side output transistor low, keeping that transistor off. As the input voltage increases, the output of the differential amplifier falls, gradually turning the N-channel low-side transistor off. The drain of the gate drive transistor remains biased near the low voltage rail until the current-carrying capacity of the gate drive transistor is equal to the magnitude of the current supplied by the current source. At that point, the voltage at the drain of the gate drive transistor increases and gradually turns the N-channel high-side transistor on.

The output stage of this invention thus contains only N-channel output transistors, prevents clipping as the output voltage approaches the negative voltage rail, and provides a relatively stable and predictable quiescent current.

In the preferred embodiment, a capacitive coupling stage is connected to the gate of the high-side transistor to prevent clipping as the output voltage approaches the positive voltage rail. The capacitive coupling stage includes a charge pump capacitor and a diode connected in series between a source of a gate drive voltage for the high-side transistor (e.g., the drain of the gate drive transistor) and the positive voltage rail. A P-channel transistor is connected between the gate of the high-side N-channel transistor and a common node between the charge pump capacitor and the diode. When the voltage provided by the source of the gate drive voltage goes low, the charge pump capacitor charges up through the diode. When the voltage provided by the source of the gate drive voltage goes high, the diode becomes reverse-biased, and the P-channel transistor is turned on, thereby allowing current to flow from the charge pump capacitor to the gate of the high-side transistor. In this manner, the voltage at the gate of the high-side transistor is increased to a level above the positive voltage rail.

The capacitive coupling stage also includes a discharge transistor which is connected between the gate of the high-side transistor and the source of gate drive voltage, in parallel with the charge pump capacitor and the P-channel transistor. When the gate drive voltage falls, the discharge transistor turns on, allowing a current to flow from the gate of the high-side transistor, thereby reducing the voltage at the gate of the high-side transistor. A bypass capacitor is also connected in parallel with the pump capacitor and the P-channel transistor, to improve the responsiveness of the high-side transistor to small variations in the gate drive voltage.

The capacitive coupling stage of this invention may be used in any situation in which the gate of a transistor (N-channel or P-channel) is to be biased to a voltage level which is beyond (above or below) the level of a voltage rail used to supply the transistor. The capacitive coupling stage of this invention may be used with digital devices such as power inverters, and with analog or digital devices in which the output transistors are P-channel. If the output transistors are P-channel, then the capacitive coupling stage would include an N-channel transistor and would be connected to the low-side transistor rather than the high-side transistor.

DESCRIPTION OF THE INVENTION

Figure 4A:
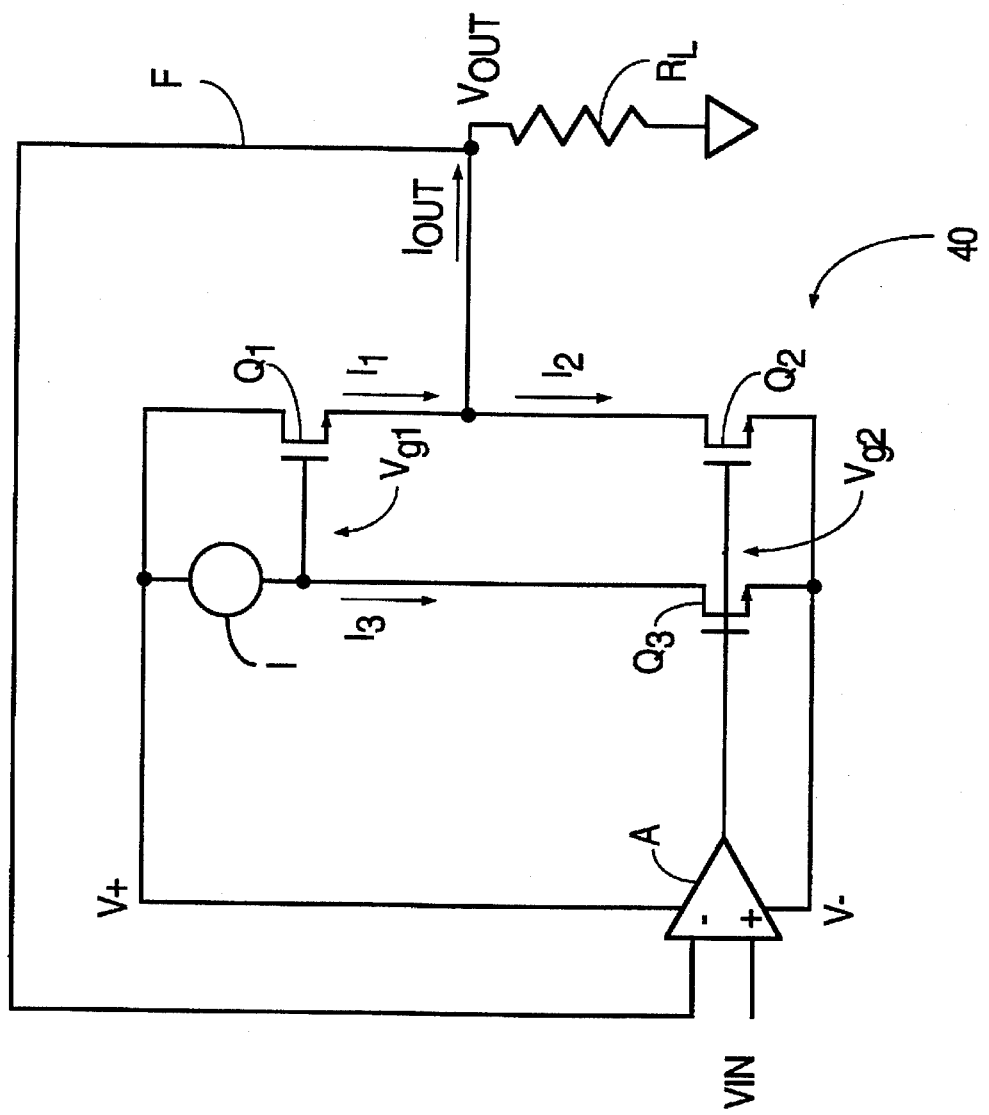
FIG. 4A illustrates a schematic circuit diagram of an amplifier in accordance with a first embodiment of the invention.

An amplifier in accordance with this invention provides improved quiescent current stability and reduced crossover distortion. A first embodiment is shown as amplifier 40 in FIG. 4A. Amplifier 40 includes a high-side output transistor $Q_1$ and a low-side output transistor $Q_2$, both of which are N-channel transistors. The output of differential amplifier A, designated $V_{g2}$, is delivered to the gates of low-side transistor $Q_2$ and gate drive transistor $Q_3$. The output transistors $Q_1$ and $Q_2$ are much larger than gate drive transistor $Q_3$ and might, for example, carry a current of 100 times the current carried by transistor $Q_3$. Amplifier 40 is shown with 100% negative feedback, a line F being connected from the output terminal to the negative input terminal of differential amplifier A. Amplifier A is typically a high-gain amplifier (e.g., gain=50,000) so that $V_{IN}$ is approximately equal to $V_{OUT}$.

Gate drive transistor $Q_3$ is supplied by current source I, transistor $Q_3$ and current source I being connected in series between the positive voltage rail V+ and the negative voltage rail V−. The drain of transistor $Q_3$ is connected to the gate of transistor $Q_1$, the voltage at the gate of transistor $Q_1$ being designated $V_{g1}$.

Figure 4B:
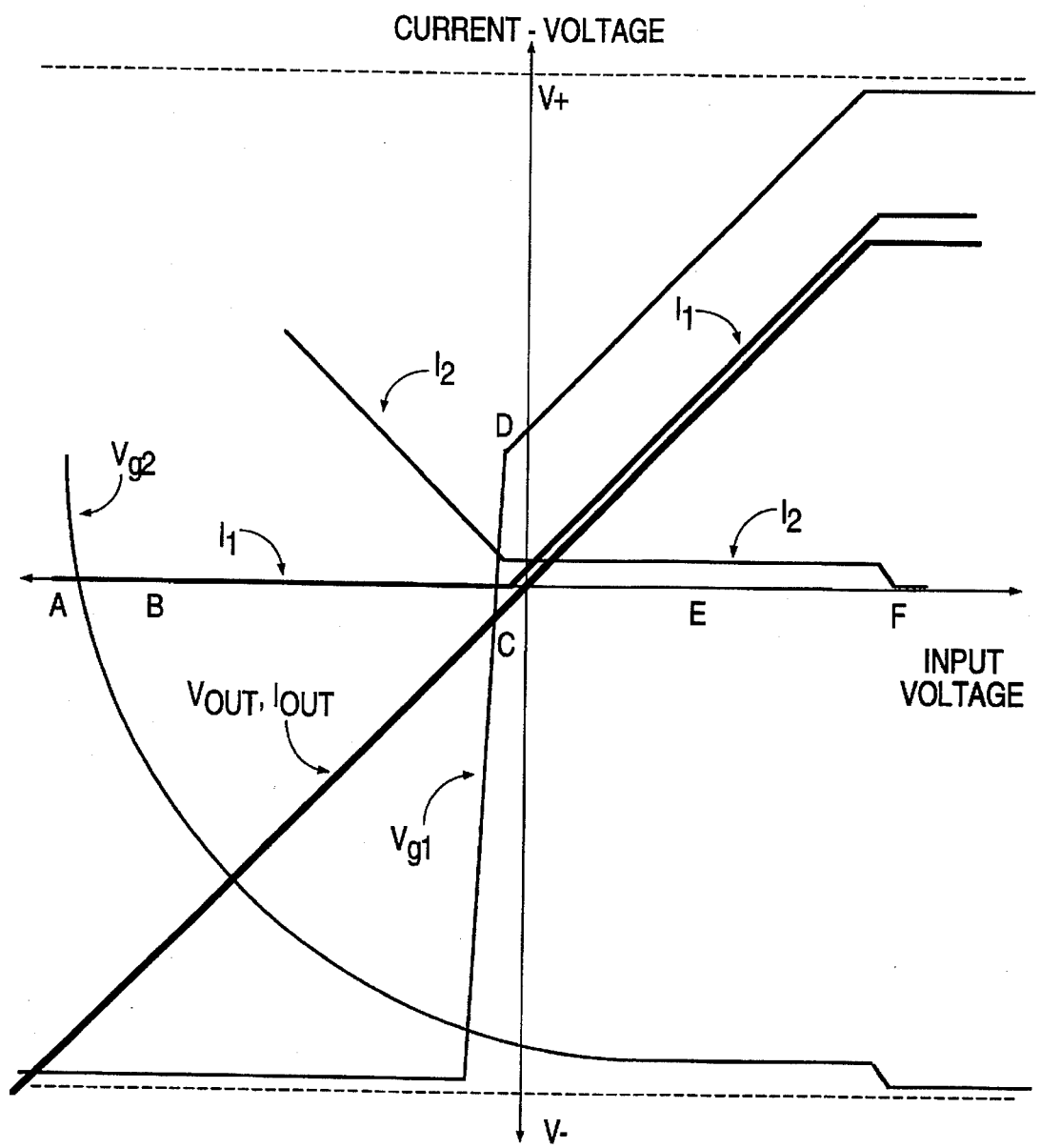
FIG. 4B illustrates waveforms useful in describing the operation of the amplifier shown in FIG. 4A.

The operation of amplifier 40 will be described with reference to FIGS. 4B and 4C, in which the horizontal axis is $V_{IN}$. Several regions of operation of the amplifier will be described, starting with a region "A", shown in FIG. 4B, where $V_{IN}$ is near the most negative end of its range, and proceeding through regions "B", "C", "D" and "E" to region "F", where $V_{IN}$ is near the most positive end of its range.

In region "A", $V_{IN}$ is near the most negative end of its range. The output current $I_{OUT}$ is at a high absolute value and is flowing from ground through the load resistor $R_L$ and transistor $Q_2$ to the negative voltage rail V−. The common gate voltage $V_{g2}$ of transistors $Q_2$ and $Q_3$ is driven sufficiently high by the differential amplifier A to sustain this level of current in transistor $Q_2$. The voltage $V_{g1}$ at the drain of transistor $Q_3$ is near the negative voltage rail V− because the current $I_3$ supplied by current source I is far below the level of current that transistor $Q_3$ could conduct given the high gate voltage $V_{g2}$ applied to the gate of transistor $Q_3$. The drain current that transistor $Q_3$ could conduct in this situation is equal to $I_2$ divided by the scale factor between transistors $Q_2$ and $Q_3$, e.g., 100. Thus, if $I_2$=1A (e.g., a load resistor $R_L$=4 ohms driven to a maximum negative voltage of 4V), this "implicit" current through transistor $Q_3$ would be 10 mA.

The current $I_3$ supplied by current source I is selected so as to cause a desired quiescent current to flow through transistors $Q_1$ and $Q_2$ when $V_{OUT}$=0. In this condition the quiescent current ($I_1$=$I_2$) is equal to $I_3$ times the scale factor between transistors $Q_3$ and $Q_2$.

In region "A", the low drain voltage of transistor $Q_3$ ($V_{g1}$) causes transistor $Q_1$ to be turned off.

In region "B", as $V_{IN}$ becomes less negative, the load current $I_{OUT}$ decreases in absolute magnitude (becomes less negative), and the gate voltage $V_{g2}$ required to support the reduced drain current in transistor $Q_2$ decreases along a parabolic curve reflecting the square law characteristic of transistor $Q_2$. $V_{OUT}$ increases linearly with increasing $V_{IN}$ in region "B".

Figure 4C:
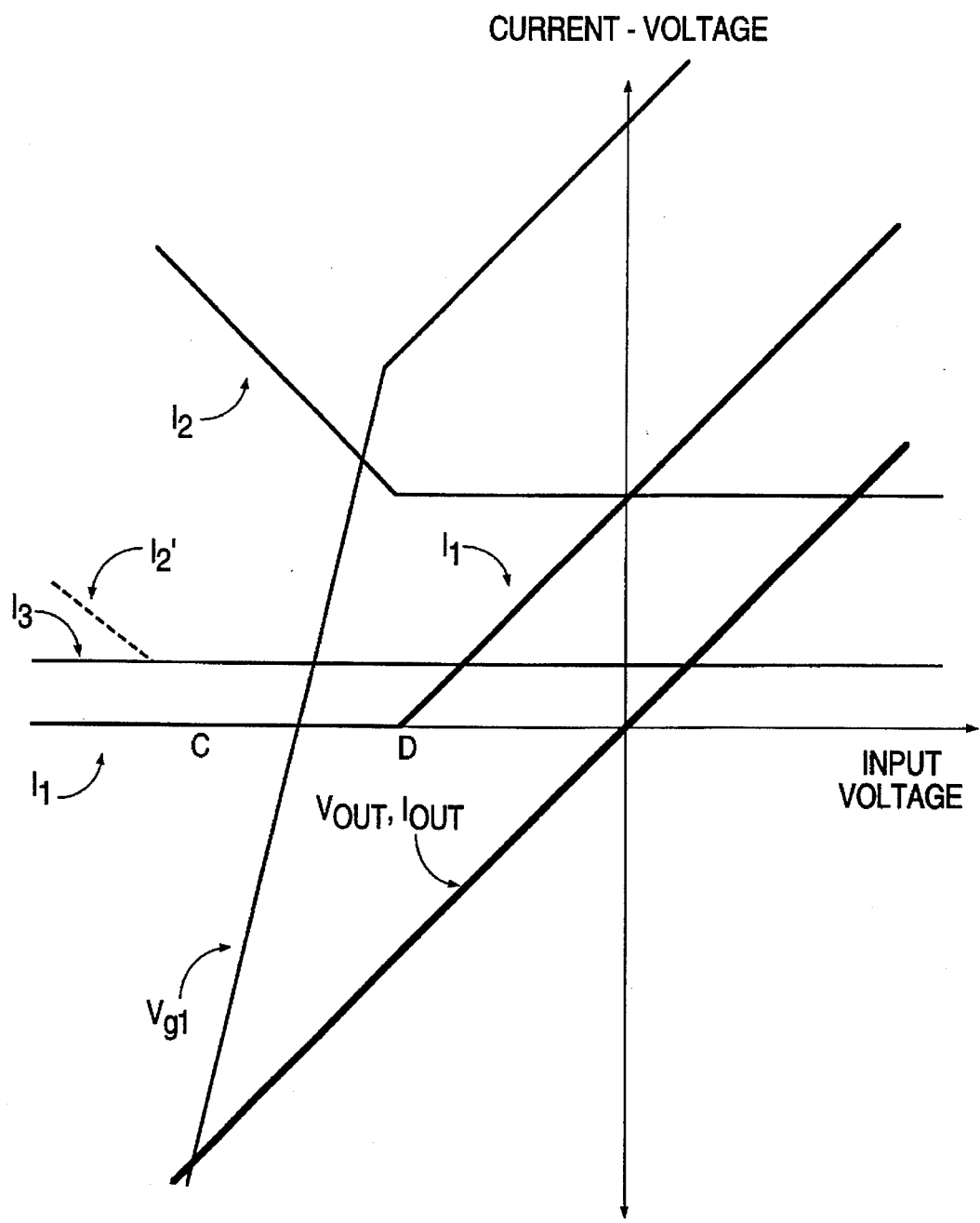
FIG. 4C illustrates a detailed view of the waveforms shown in FIG. 4B in the region near zero output voltage.

The operation of amplifier 40 in regions "C" and "D" is best understood by referring to the detailed view of FIG. 4C. As $V_{OUT}$ approaches zero volts, $I_2$ continues to fall. The "implicit" drain current of transistor $Q_3$ ($I_2$ divided by the scaling factor), designated as $I_2'$ in FIG. 4C, also falls, until it approaches equality with the current $I_3$ supplied by current source I. At this point the drain voltage ($V_{g1}$) of transistor $Q_3$ begins to rise rapidly from near the negative voltage rail at a rate which is dependent on the output resistances of transistor $Q_3$ and the current source I. The output current $I_{OUT}$ continues to ramp down under the control of transistor $Q_2$ because transistor $Q_1$ has not yet begun to conduct sufficient current to overcome the current flowing in transistor $Q_2$ and thereby gain control of the output current $I_{OUT}$.

When the drain voltage of transistor $Q_3$ ($V_{g1}$) has reached a positive voltage in excess of the threshold voltage of transistor $Q_1$, transistor $Q_1$ begins to conduct, and control of the output current $I_{OUT}$ passes to transistor $Q_1$. The gate voltage $V_{g1}$ of transistor $Q_1$ is controlled by transistor $Q_3$, which in turn is controlled by the output of differential amplifier A.

In region "E", $V_{OUT}$ continues to rise in concert with $V_{g1}$, reflecting the source follower configuration now in effect.

Transistor $Q_2$ continues to conduct the selected quiescent current during the entire positive excursion of $V_{OUT}$, until the drive to transistor $Q_1$ is limited by the the positive voltage rail V+. The current $I_2$ through transistor $Q_2$ falls somewhat as a result of the small, progressive decrease of $V_{g2}$ but remains substantially constant in this region.

As $V_{g1}$ approaches the positive voltage rail V+, further increases in $V_{OUT}$ are limited by the clipping phenomenon described above. The physical realization of current source I cannot source current into a node higher than the positive voltage rail. $V_{OUT}$ therefore remains constant for the remainder of the swing of $V_{IN}$. This produces a collapse of the gate control voltage $V_{g2}$, as the differential amplifier A seeks a more positive output voltage $V_{OUT}$. This causes a cessation of the drain currents in transistors $Q_2$ and $Q_3$ and of $I_3$.

Figure 5:
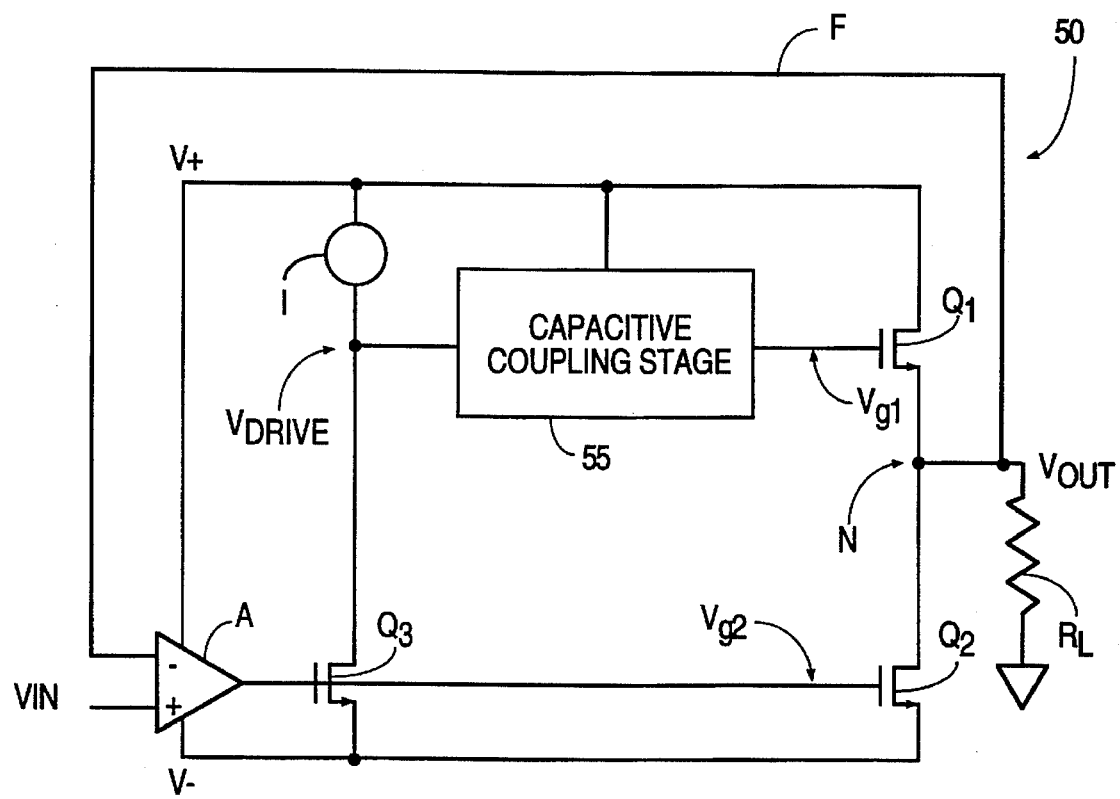
FIG. 5 illustrates an amplifier in accordance with this invention with a capacitive coupling stage shown in block form.

As will be apparent, the clipping of $V_{OUT}$ can present a serious limitation when the drain of transistor $Q_3$ is connected directly to the gate of transistor $Q_1$. This problem is overcome by the addition of a capacitive coupling stage constructed in accordance with another aspect of this invention. FIG. 5 illustrates an amplifier 50 which includes a capacitive coupling stage 55. As indicated, capacitive coupling stage 55 has an output which is connected to the gate of high-side transistor $Q_1$ and inputs which are connected to the positive voltage rail V+ and to the drain of transistor $Q_3$. The voltage at the drain of transistor $Q_3$ is designated $V_{DRIVE}$.

Figure 6A:
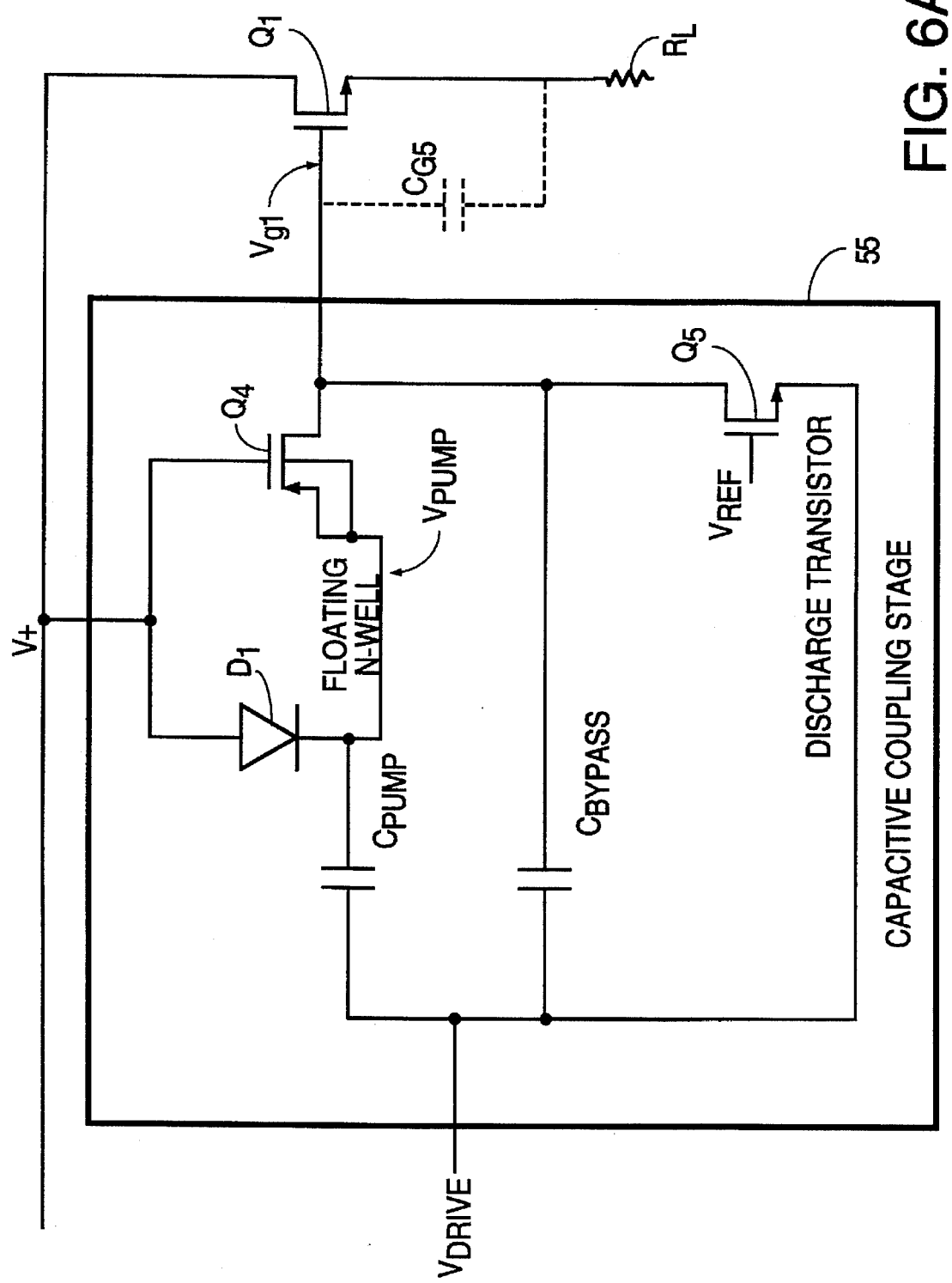
FIG. 6A illustrates a schematic circuit diagram of the capacitive coupling stage of this invention.

FIG. 6A illustrates a schematic circuit diagram of capacitive coupling stage 55. The positive voltage rail V+ is connected to the anode of a diode D1 and to the gate of a P-channel transistor $Q_4$. The cathode of diode D1 is connected to a charge pump capacitor $C_{PUMP}$ and to the source and body of P-channel transistor $Q_4$. The other terminal of capacitor $C_{PUMP}$ is connected to $V_{DRIVE}$ (the drain of transistor $Q_3$, which is not shown in FIG. 6A). The drain of P-channel transistor $Q_4$ is connected to the gate of high-side transistor $Q_1$. The gate-to-source capacitance of transistor $Q_1$ is represented by a capacitor $C_{GS}$, shown in phantom.

The remaining components of capacitive coupling stage 55 include a bypass capacitor $C_{BYPASS}$ which is connected in parallel with capacitor $C_{PUMP}$ and transistor $Q_4$, and a discharge transistor $Q_5$ which is also connected in parallel with capacitor $C_{PUMP}$ and transistor $Q_4$.

Figure 7:
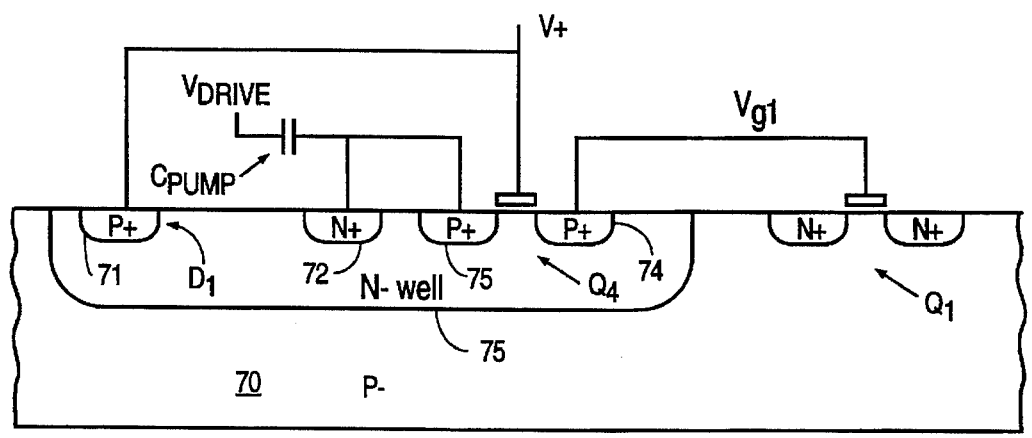
FIG. 7 illustrates a cross-sectional view of an integrated circuit which includes the capacitive coupling stage and the high-side transistor.

In the preferred embodiment, amplifier 50 is formed in an IC chip, with transistors $Q_1$, $Q_2$, $Q_3$ and $Q_5$ being formed in a P-type substrate or epitaxial layer. As indicated in FIG. 6A, P-channel transistor $Q_4$ is formed in a floating N-well ("floating" in this sense means not connected to the positive voltage supply but rather driven to appropriate voltages by other active circuit elements). A cross-sectional view of several of these components is shown in FIG. 7. A P-epitaxial layer 70 includes an N-well 75. A P+ region 71 acts as the anode of diode D1, and N-well 75 acts as the cathode of diode D1. N-well 75 is connected via an N+ region 72 to a terminal of capacitor $C_{PUMP}$ and a P+ region 73, which serves as the source of transistor $Q_4$. A P+ region 74 serves as the drain of transistor $Q_4$. The positive voltage rail V+ is connected to the gate of transistor $Q_4$, and the drain of transistor $Q_4$ (P+ region 74) is connected to the gate of transistor $Q_1$.

The operation of capacitive coupling stage 55 will now be described. As $V_{DRIVE}$ falls, capacitor $C_{PUMP}$ charges up, creating a voltage drop across capacitor $C_{PUMP}$. When $V_{DRIVE}$ rises again to the point where it equals the positive supply voltage (V+) less the voltage across capacitor $C_{PUMP}$, diode D1 becomes reverse-biased, preventing charge from flowing from capacitor $C_{PUMP}$ to the positive voltage rail. As is evident from FIGS. 6A and 7, capacitor $C_{PUMP}$ is shorted to N-well 75, which floats, and to the source of transistor $Q_4$.

In FIG. 6A, $V_{PUMP}$ designates the voltage of N-well 75, which is equal to $V_{DRIVE}$ plus the voltage across capacitor $C_{PUMP}$. As $V_{PUMP}$ increases, at some point the threshold voltage of transistor $Q_4$ is reached, and transistor $Q_4$ turns on. Typically, when transistor $Q_4$ turns on, it is in its saturated region. $V_{PUMP}$ remains relatively constant while current flows through transistor $Q_4$ to the gate of transistor $Q_1$, and $V_{g1}$ begins to increase. That is to say the gate capacitance of transistor $Q_1$, represented by capacitor $C_{GS}$, begins to charge up.

When capacitor $C_{GS}$ has charged to a certain point, the drain-to-source voltage across transistor $Q_4$ falls to a level where transistor $Q_4$ moves out of saturation and begins to operate in it "triode" region, where it acts as a resistor.

Figure 6B:
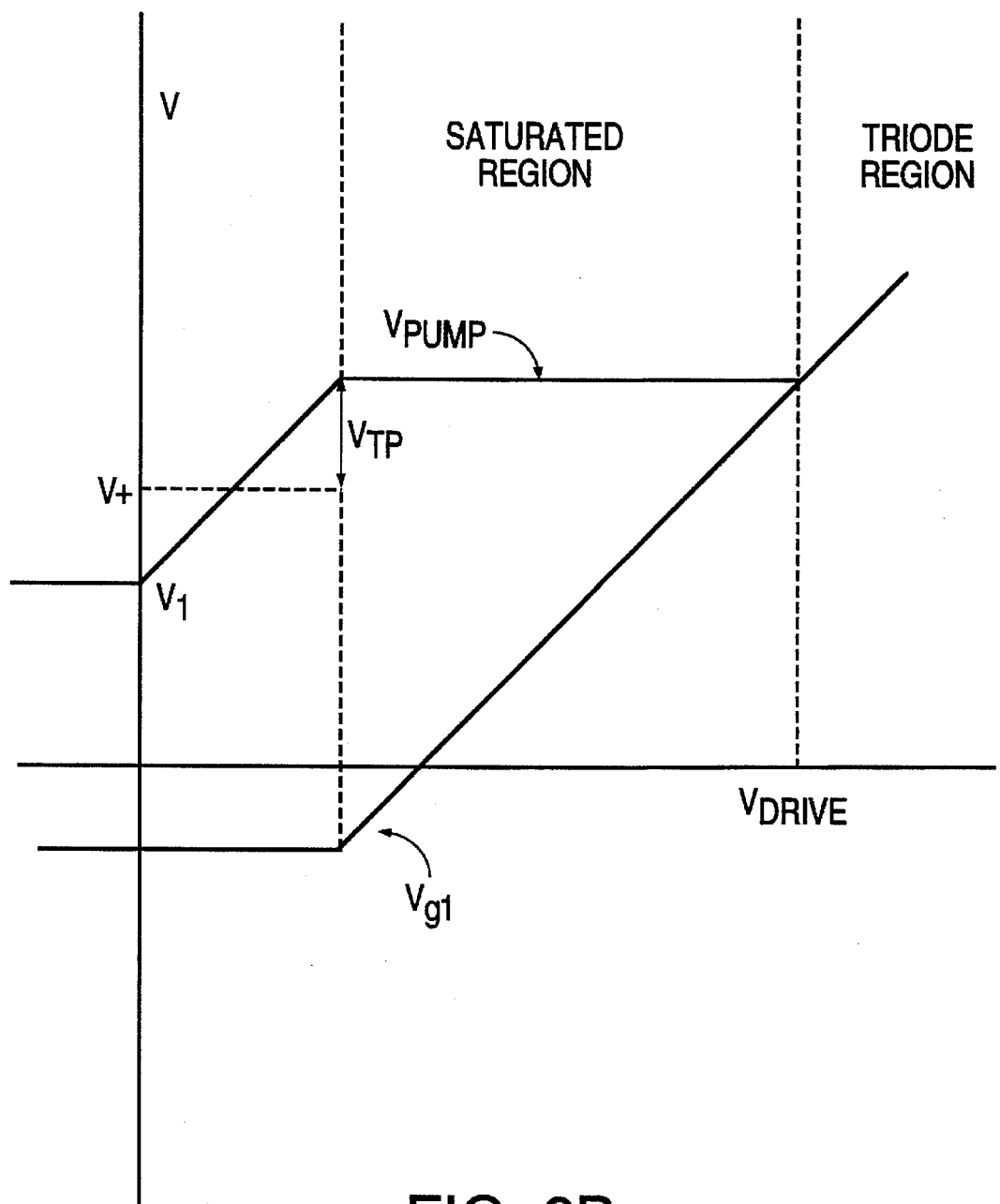
FIG. 6B illustrates waveforms showing the behavior of the output voltage and the gate drive voltage in an amplifier constructed in accordance with this invention.

The behavior of $V_{PUMP}$ and $V_{g1}$ are illustrated in FIG. 6B, wherein the horizontal axis is $V_{DRIVE}$. $V_1$ is the voltage drop across capacitor $C_{PUMP}$ and $V_{TP}$ is the threshold voltage of transistor $Q_4$. As $V_{DRIVE}$ increases, $V_{PUMP}$ increases until it reaches a level which is $V_{TP}$ above V+. At this point, transistor $Q_4$ turns on, quickly becomes saturated and $V_{PUMP}$ remains constant while $V_{g1}$ begins to increase. While transistor $Q_4$ is saturated, current continues to flow to the gate of transistor $Q_1$, and $V_{g1}$ increases until it reaches the level of $V_{PUMP}$. When this occurs, transistor $Q_4$ begins to operate in its triode region, and $V_{PUMP}$ and $V_{g1}$ increase substantially together.

As $V_{DRIVE}$ falls, transistor $Q_4$ is initially in its triode region and $V_{g1}$ and $V_{PUMP}$ fall together. At some point, however, transistor $Q_4$ begins to turn off, and the gate of transistor $Q_1$ is no longer resistively coupled to floating N-well 75. When $V_{DRIVE}$ has fallen a threshold voltage below the reference voltage $V_{REF}$ at the gate of transistor $Q_5$, transistor $Q_5$ turns on and creates a discharge path for the gate of transistor $Q_1$. The voltage $V_{REF}$ at the gate of transistor $Q_5$ is typically set between V+ and V−. In one embodiment, for example, where V+ was 5 V and V− was ground, $V_{REF}$ was set at 1.4 V.

As $V_{DRIVE}$ continues to fall, ultimately diode D1 becomes forward-biased and capacitor $C_{PUMP}$ begins to charge again. Discharge transistor $Q_5$ need not turn on at the same time that transistor $Q_4$ turns off; instead, there may be a "dead zone" between the turn-off of transistor $Q_4$ and the turn-on of transistor $Q_5$. Normally the output stage of amplifier 50 is preceded by sufficient amplification that any dead zone occurring between the turn-off of transistor $Q_4$ and the turn-on of transistor $Q_5$ is taken up by the gain of the preceding stages. As shown in FIG. 5, amplifiers such as amplifier 50 are typically used in configurations which include negative feedback. Provided that the output stage is preceded by sufficient gain, a small dead zone can be tolerated at certain points.

Capacitor $C_{BYPASS}$ is used to couple variations in $V_{DRIVE}$ to the gate of transistor $Q_1$ in the interval in which transistor $Q_4$ is saturated. As shown in FIG. 6B, in the "saturated region" of transistor $Q_4$, $V_{PUMP}$ remains relatively constant while the gate of transistor $Q_1$ charges. Thus the coupling between $V_{DRIVE}$ and $V_{g1}$ is somewhat weakened in this interval, and capacitor $C_{BYPASS}$ helps to improve the responsiveness of $V_{g1}$ to fluctuations in $V_{DRIVE}$ in this interval.

Figure 1A:
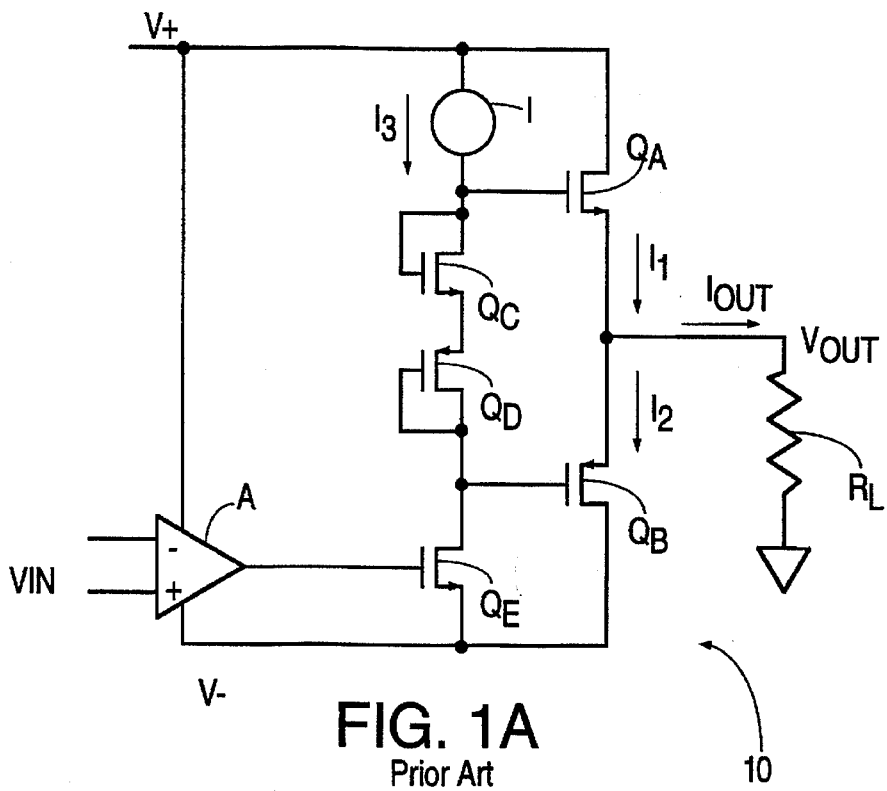
FIG. 1A illustrates a schematic circuit diagram of a conventional audio amplifier.
Figure 1B:
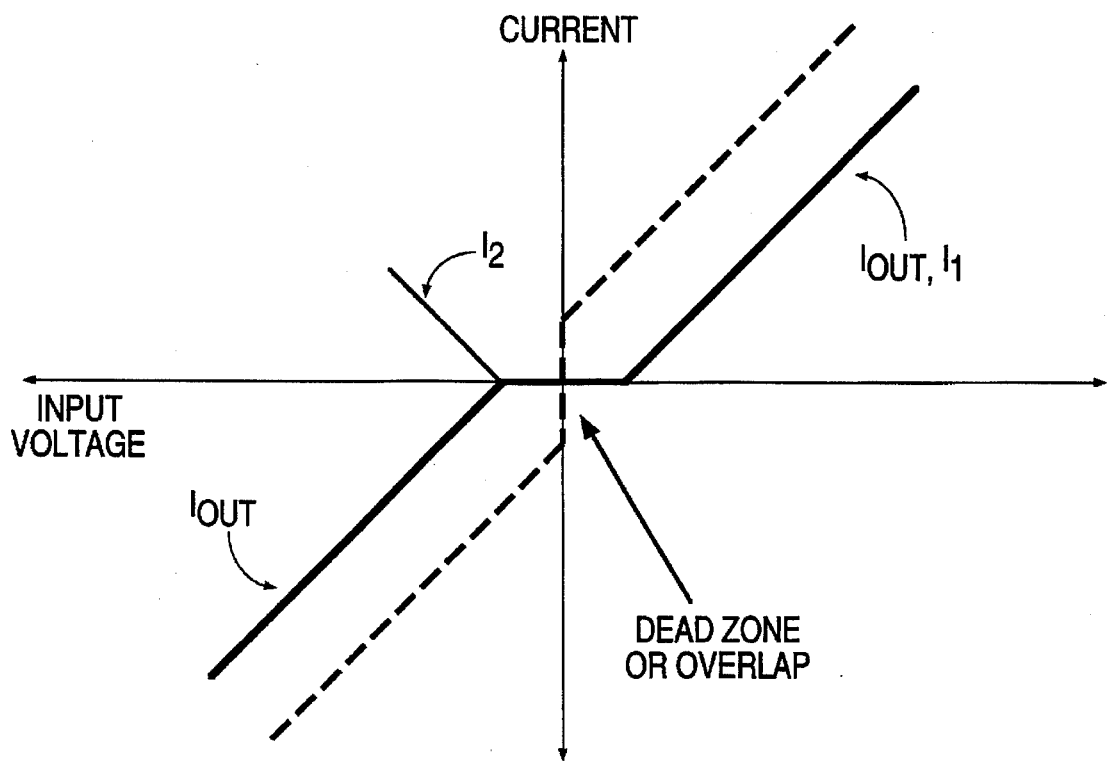
FIG. 1B illustrates a graph showing possible crossover characteristics of the amplifier shown in FIG. 1A.
Figure 1C:
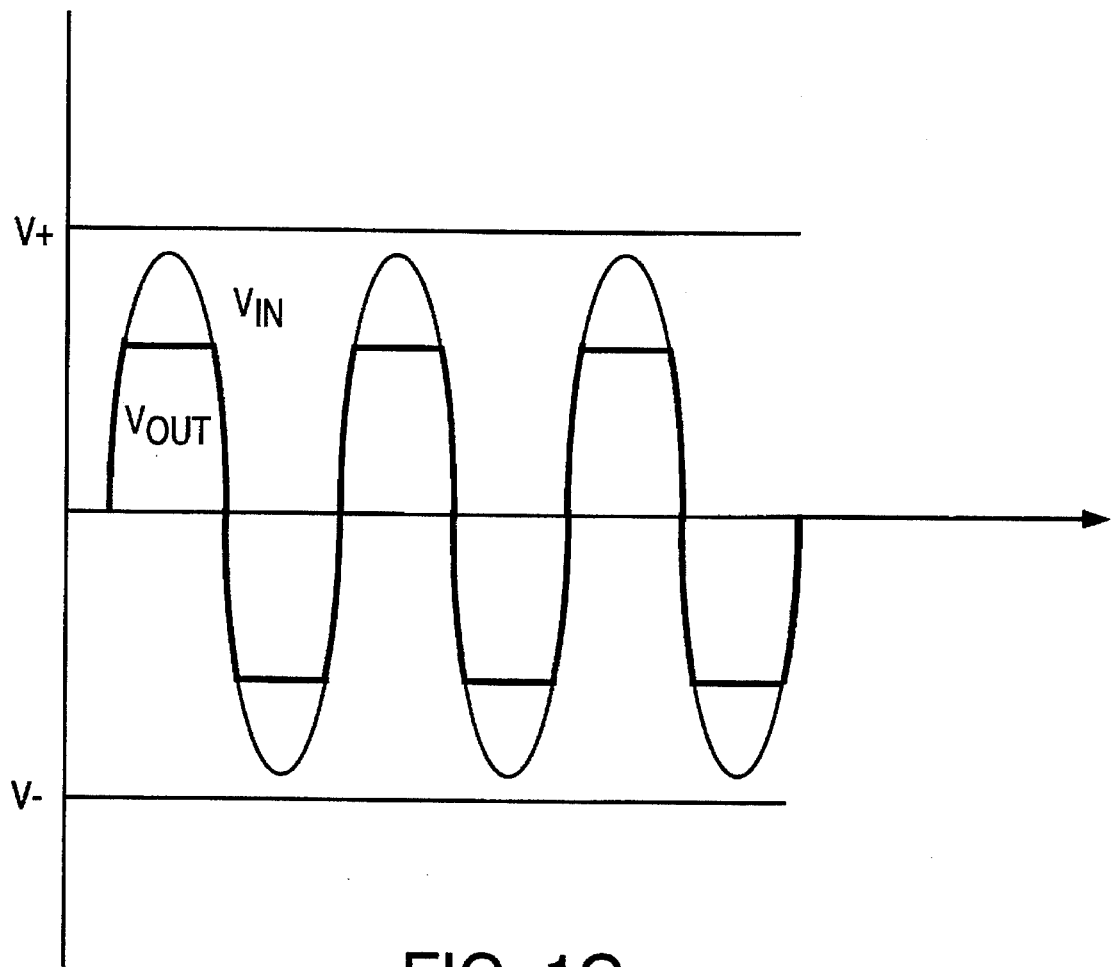
FIG. 1C illustrates a graph showing the clipping of the output voltage in the amplifier shown in FIG. 1A.
Figure 2A:
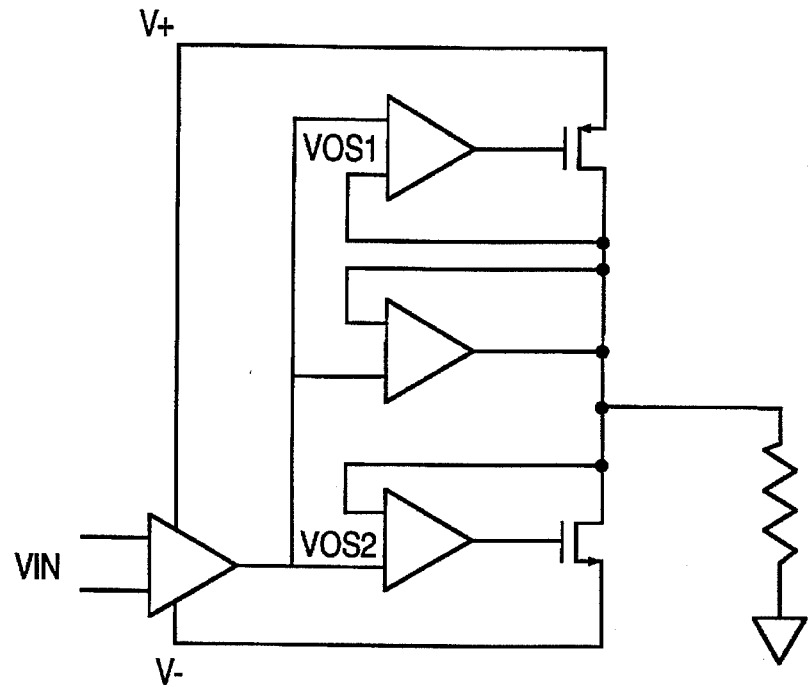
FIG. 2A illustrates a schematic circuit diagram of a known circuit for avoiding a dead zone at the crossover of an amplifier of the kind shown in FIG. 1A.
Figure 2B:
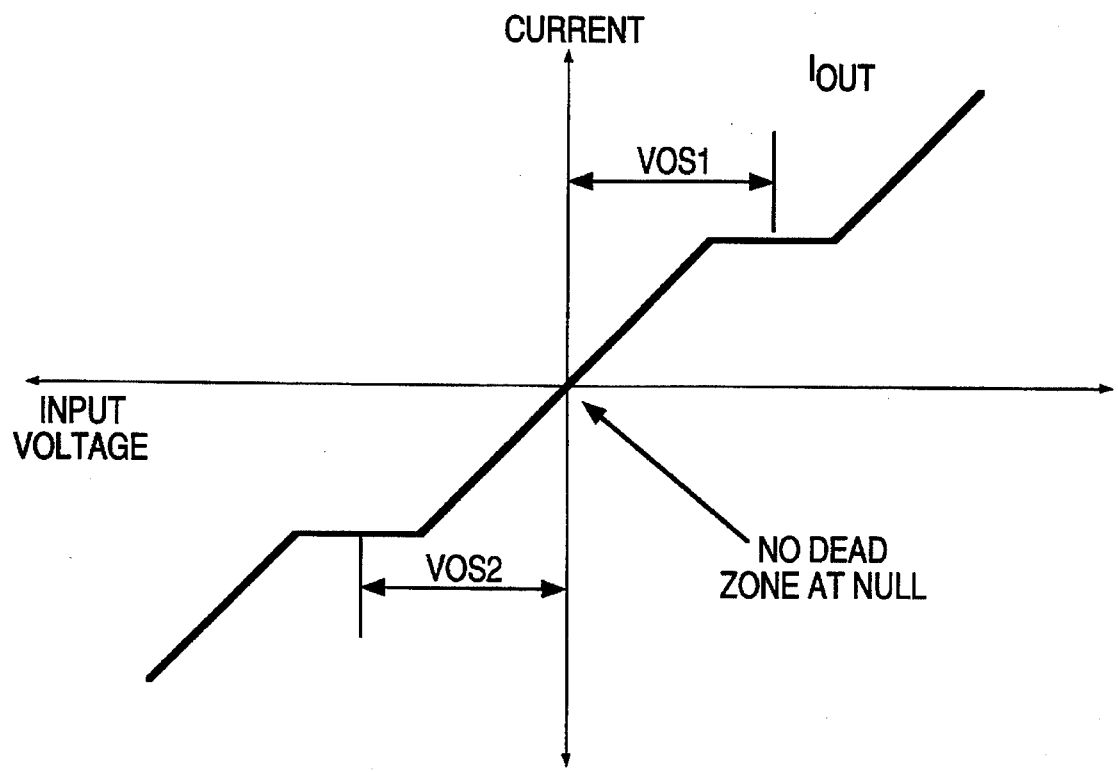
FIG. 2B illustrates a graph showing the crossover characteristic of the amplifier shown in FIG. 2A.
Figure 3A:
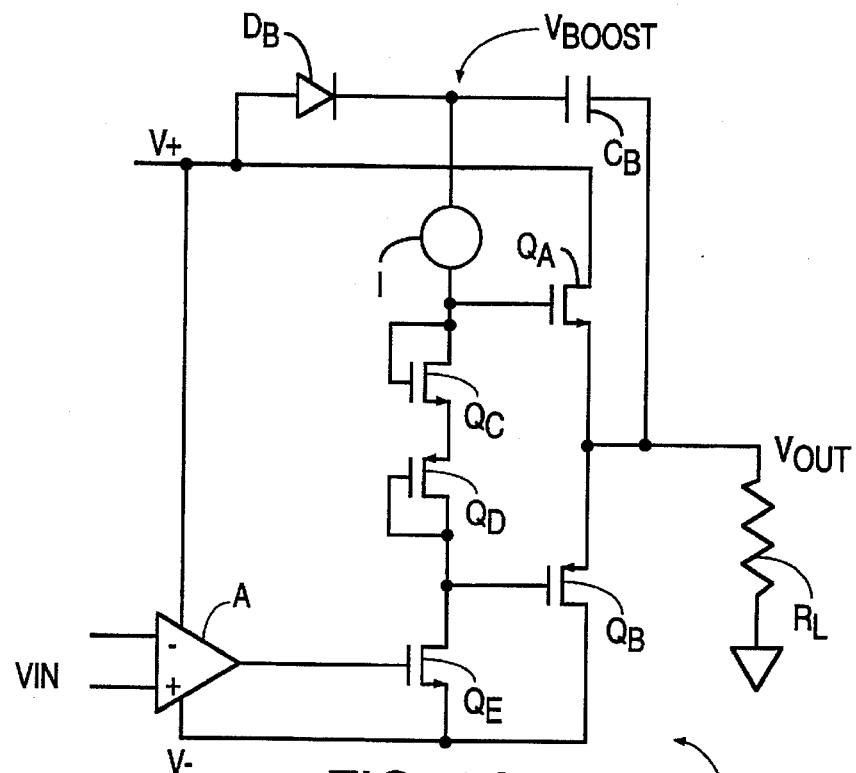
FIG. 3A illustrates a schematic circuit diagram of the amplifier of FIG. 1A including a charge pump arrangement to boost the gate drive for the high-side transistor.
Figure 3B:
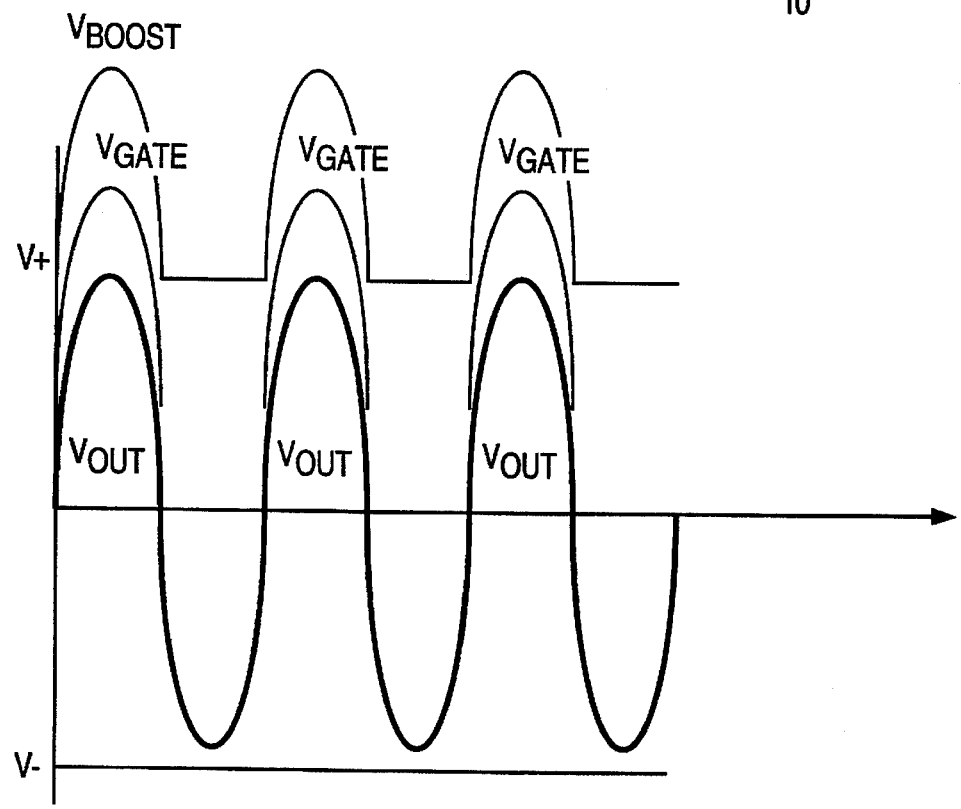
FIG. 3B illustrates waveforms showing the behavior of the output voltage and the gate drive voltage in the device shown in FIG. 3A.

Using well-known techniques, both capacitor $C_{PUMP}$ and capacitor $C_{BYPASS}$ may be fabricated on the same chip with the other components of capacitive coupling stage 55. Capacitor $C_{PUMP}$ and capacitor $C_{BYPASS}$ may be in the range of 10 to 20 picofarads, but capacitor $C_{BYPASS}$ is much smaller (e.g., one fifth the size) of capacitor $C_{PUMP}$. By comparison, bootstrap capacitors such as capacitor $C_B$ shown in FIG. 3A typically have values in the hundreds of microfarads and are electrolytic capacitors. Capacitor $C_{PUMP}$ is much smaller and in fact is frequently represented by the gate-to-body capacitance of a MOSFET in the circuit. Capacitor $C_{PUMP}$ can be smaller than a normal bootstrap capacitor because the charge is effectively constrained by the reverse-biased diode D1, capacitor $C_{BYPASS}$, the non-conductive discharge transistor $Q_5$ and the gate-to-body capacitances of transistors $Q_1$ and $Q_4$. By contrast, bootstrap capacitor $C_B$ can discharge through the current source I.

Figure 8:
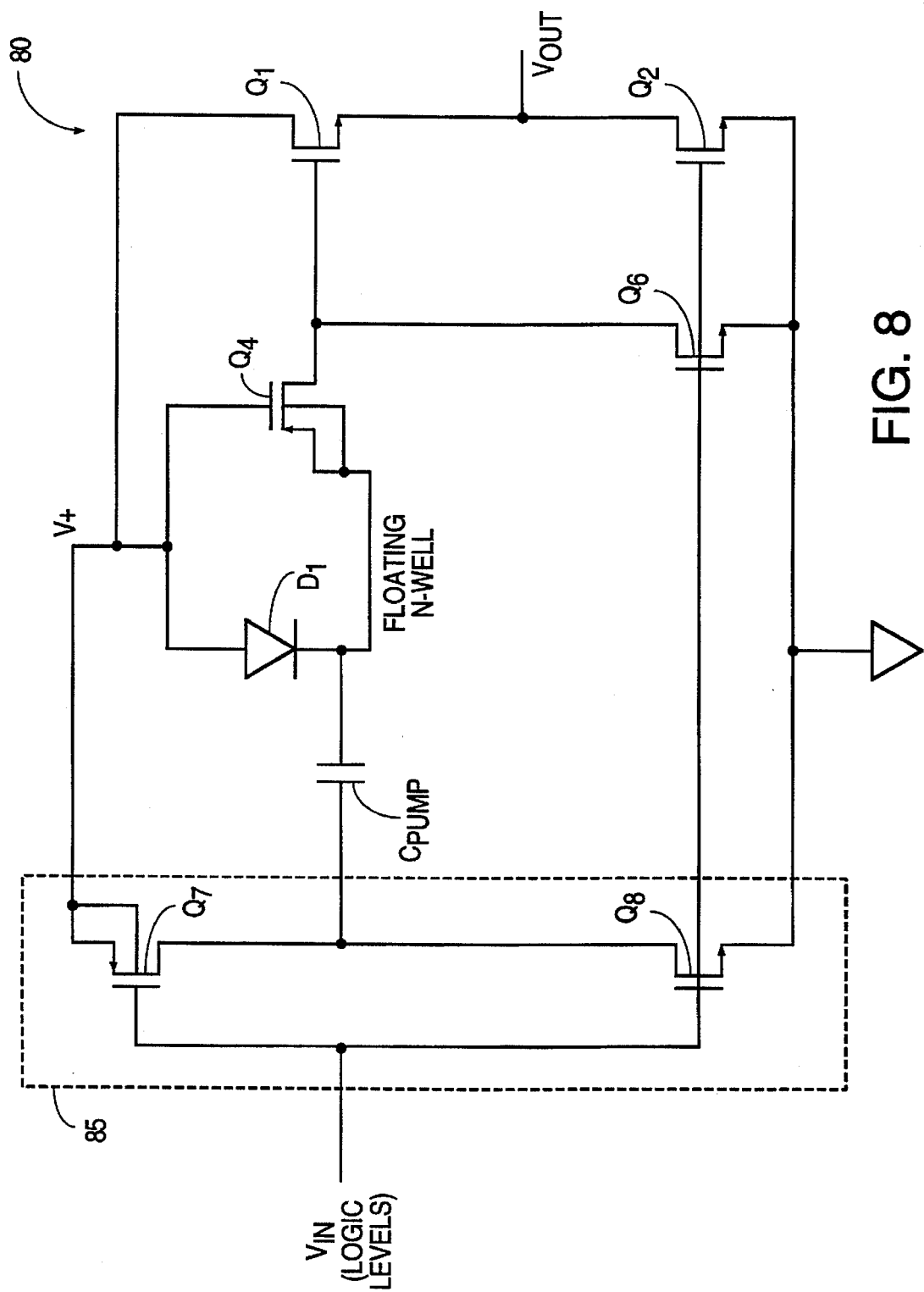
FIG. 8 illustrates a schematic circuit diagram of a power inverter which includes a capacitive coupling stage in accordance with this invention.

The principles of this invention are also applicable to logic circuitry. FIG. 8 shows a power inverter 80 in which a digital input signal $V_{IN}$ is delivered to a CMOS inverter 85. Inverter 85, which is conventional, contains a P-channel transistor $Q_7$ and an N-channel transistor $Q_8$, connected in a series path between positive voltage rail V+ and ground. The output of inverter 85 is connected to capacitor $C_{PUMP}$ which is connected to diode D1 and transistor $Q_4$ in the same manner as in capacitive coupling stage 55 shown in FIG. 6A. The gate of transistor $Q_8$ is connected to the respective gates of a transistor $Q_6$ and of low-side transistor $Q_2$. The drain of transistor $Q_4$ is connected to the gate of high-side transistor $Q_1$.

When $V_{IN}$ is a logic high, N-channel transistor $Q_8$ is turned on, as are transistors $Q_6$ and $Q_2$. With transistor $Q_6$ turned on, the gate of transistor $Q_1$ is grounded, turning transistor $Q_1$ off. Thus $V_{OUT}$ is a logic low.

At the same time, with transistor $Q_8$ turned on, capacitor $C_{PUMP}$ charges through diode D1. When $V_{IN}$ shifts to a logic low, transistor $Q_7$ is turned on, and the left hand terminal of capacitor $C_{PUMP}$ is biased at approximately V+. As described above, diode D1 is reverse-biased and P-channel transistor $Q_4$ is turned on, delivering a voltage approximately equal to V+, plus the voltage across capacitor $C_{PUMP}$, to the gate of transistor $Q_1$. Thus the gate of transistor $Q_1$ is biased at a level which is significantly above the positive supply voltage V+ and transistor $Q_1$ is turned fully on.

When $V_{IN}$ shifts back to a logic high, the gate of transistor $Q_1$ discharges through transistor $Q_6$ to ground.

Typically transistors $Q_1$ and $Q_2$ are considerably larger than transistors $Q_7$ and $Q_8$ and therefore conduct a much higher current than do transistors $Q_7$ and $Q_8$. Power inverter 80 might be used, for example, in driving a bus. Because of the much higher mobility of N-channel devices, transistors $Q_1$ and $Q_8$ occupy less "real estate" on an IC chip then they would if one of them were a P-channel transistor. This savings is so substantial that the entire area occupied by power inverter 80 is less than the area that would be occupied by inverter 85 alone, if P-channel transistor $Q_7$ were made large enough to handle the current that flows through transistor $Q_1$.

The principles of this invention have broad applicability to devices in which it is desired to bias the gate of a transistor at a voltage which is outside the range defined by the positive and negative voltage supply rails. While specific embodiments have been described, numerous and varied alternative embodiments will be apparent to those skilled in the art.

I claim:

1. An amplifier comprising:
    an N-channel high-side transistor and an N-channel low-side transistor connected in series between positive and negative voltage rails;
    an N-channel gate drive transistor;
    an input stage amplifier having an output coupled in common to the gates of said low-side and gate drive transistors; and a current source for supplying a constant current to said gate drive transistor, the drain of the gate drive transistor being coupled to the gate of said high-side transistor, wherein a magnitude of the constant current is approximately equal to a magnitude of a quiescent current divided by a scale factor, the quiescent current being a current flowing through the high-side and low-side transistors when a magnitude of a current flowing through the high-side transistor is equal to a magnitude of a current flowing through the low-side transistor, the scale factor being equal to a current capacity of the low-side transistor divided by a current capacity of the gate drive transistor.

2. An amplifier comprising:
an N-channel high-side transistor and an N-channel low-side transistor connected in series between positive and negative voltage rails;
an N-channel gate drive transistor;
an input stage amplifier having an output coupled in common to the gates of said low-side and gate drive transistors; and
a current source for supplying a constant current to said gate drive transistor, the drain of the gate drive transistor being coupled through a capacitive coupling stage to the gate of said high-side transistor.

3. The apparatus of claim 2 wherein a magnitude of the constant current is approximately equal to a magnitude of a quiescent current divided by a scale factor, the quiescent current being a current flowing through the high-side and low-side transistors when a magnitude of a current flowing through the high-side transistor is equal to a magnitude of a current flowing through the low-side transistor, said scale factor being equal to a current capacity of the low-side transistor divided by a current capacity of the gate drive transistor.

4. An amplifier comprising:
an N-channel high-side transistor and an N-channel low-side transistor connected in series between positive and negative voltage rails;
an N-channel gate drive transistor;
a input stage amplifier having an output coupled in common to the gates of said low-side and gate drive transistors; and
a current source for supplying a current to said gate drive transistor, the drain of the gate drive transistor being coupled through a capacitive coupling stage to the gate of said high-side transistor, said capacitive coupling stage comprising:
a charge pump capacitor and a diode connected in series between said drain of said gate drive transistor and said positive voltage rail; and
a P-channel transistor connected between a common node between said charge pump capacitor and said diode and a gate of said high-side transistor.

5. The amplifier of claim 4 wherein a gate of said P-channel transistor is connected to said positive voltage rail.

6. The amplifier of claim 5 wherein the body and source of said P-channel transistor are connected to said common node between said charge pump capacitor and said diode.

7. The amplifier of claim 6 wherein the drain of said P-channel transistor is connected to said gate of said high-side transistor.

8. The amplifier of claim 4 wherein said capacitive coupling stage further comprises a discharge transistor connected in parallel with said charge pump capacitor and said P-channel transistor.

9. The amplifier of claim 4 wherein said capacitive coupling stage further comprises a bypass capacitor connected in parallel with said charge pump capacitor and said P-channel transistor.

10. An amplifier comprising:
an N-channel high-side transistor and an N-channel low-side transistor connected in series between positive and negative voltage rails;
gate drive circuitry for said high-side transistor, said gate drive circuitry comprising a capacitive coupling stage, said capacitive coupling stage comprising:
a charge pump capacitor and a diode connected in series; and
a P-channel transistor connected between a common node between said charge pump capacitor and said diode and a gate of said high-side transistor.

11. The amplifier of claim 10 wherein a gate of said P-channel transistor is connected to said positive voltage rail.

12. The amplifier of claim 11 wherein the body and source of said P-channel transistor are connected to said common node between said charge pump capacitor and said diode.

13. The amplifier of claim 12 wherein the drain of said P-channel transistor is connected to said gate of said high-side transistor.

14. The amplifier of claim 10 wherein said capacitive coupling stage further comprises a discharge transistor connected in parallel with said charge pump capacitor and said P-channel transistor.

15. The amplifier of claim 10 wherein said capacitive coupling stage further comprises a bypass capacitor connected in parallel with said charge pump capacitor and said P-channel transistor.

16. An output stage of an amplifier or inverter comprising:
a first transistor having source and drain regions of a first conductivity type;
a second transistor having source and drain regions of said first conductivity type, said first and second transistors being connected in series between a first voltage source and a second voltage source; and
a capacitive coupling stage connected to a gate of said first transistor, said capacitive coupling stage comprising:
a charge pump capacitor and a diode connected in series between a source of a gate drive voltage for said first transistor and said first voltage source; and
a third transistor connected between a common node between said charge pump capacitor and said diode and a gate of said first transistor, said third transistor having source and drain regions of a second conductivity type, a gate of said third transistor being connected to said first voltage source.

17. The output stage of claim 16 wherein said first and second transistors are N-channel transistors and said third transistor is a P-channel transistor, said first transistor being a high-side transistor and said second transistor being a low-side transistor.

18. The output stage of claim 16 wherein said transistors are formed in integrated form in a substrate, said source and drain regions of said third transistor being formed in a well of said first conductivity type.

19. The output stage of claim 18 wherein said source region of said third transistor is shorted to said well.

20. The output stage of claim 16 wherein said capacitive coupling stage further comprises a fourth transistor connected in parallel with said charge pump capacitor and said third transistor.

21. The output stage of claim 16 wherein said capacitive coupling stage further comprises a bypass capacitor connected in parallel with said charge pump capacitor and said third transistor.

* * * * *